United States Patent
Laue

[11] Patent Number: 5,864,749
[45] Date of Patent: Jan. 26, 1999

[54] TELECOMMUNICATION TERMINAL

[75] Inventor: Frank Laue, Denkte, Germany

[73] Assignee: Robert Bosch GmbH, Stuttgart, Germany

[21] Appl. No.: 973,007
[22] PCT Filed: Apr. 30, 1996
[86] PCT No.: PCT/DE96/00743
§ 371 Date: Feb. 20, 1998
§ 102(e) Date: Feb. 20, 1998
[87] PCT Pub. No.: WO96/37959
PCT Pub. Date: Nov. 28, 1996

[30] Foreign Application Priority Data

May 26, 1995 [DE] Germany .................. 195 19 421.7

[51] Int. Cl.$^6$ .................................................. H04Q 7/32
[52] U.S. Cl. .......................... 455/76; 455/264; 455/256
[58] Field of Search .............................. 455/76, 231, 256, 455/196.1, 255, 261, 264, 265; 331/44, 176, 47, 66; 333/234

[56] References Cited

U.S. PATENT DOCUMENTS 5,548,252 8/1996 Watanabe et al. ..................... 331/176
5,731,742 3/1998 Wojewoda et al. ..................... 331/44

*Primary Examiner*—Wellington Chin
*Assistant Examiner*—Keith Ferguson
*Attorney, Agent, or Firm*—Kenyon & Kenyon

[57] ABSTRACT

A telecommunications unit has an oscillating crystal as frequency standard, in which the temperature response of the oscillating crystal is counteracted by a compensation mode inserted into the unit's microprocessor prior to execution of the operating program.

4 Claims, 1 Drawing Sheet

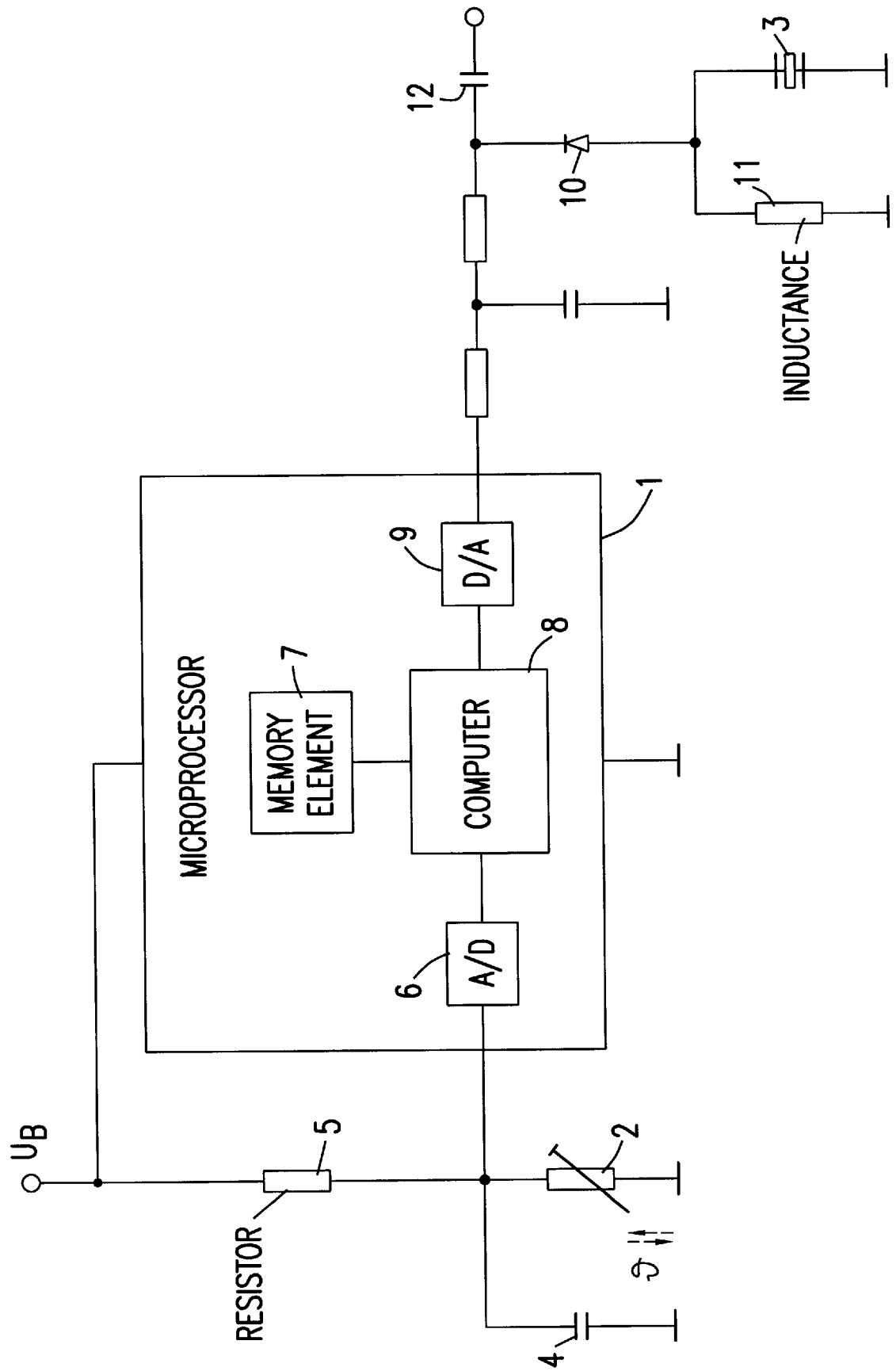

TELECOMMUNICATION TERMINAL

FIELD OF THE INVENTION

The present invention relates to a telecommunications subscriber unit, and in particular to a mobile telephone.

In modern digitally operated mobile telephones and similar subscriber units, the temperature response to which even a voltage-controlled quartz oscillator is subject makes itself evident in disadvantageous fashion if, for example, the utilization location is shifted within a short time from indoors to outdoors during the winter.

The invention differs from the known subscriber units by means of the features of the characterizing portion of claim 1.

Digitally temperature-compensated quartz oscillators for a frequency range of up to 25 MHz are generally known. Here the oscillating crystal and a microprocessor are surrounded, together with a control circuit to generate the correction voltage, by a common housing. Such quartz oscillator is very complex, and its use in telecommunications subscriber units, the demand for which is now very high, is therefore subject to considerable drawback.

SUMMARY OF THE INVENTION

A telecommunications unit according to the present invention includes an oscillator circuit whose frequency standard device has a temperature response. The telecommunications unit also includes a programmed microprocessor for controlling the execution of the unit functions, which is activated by a start instruction given from outside. The telecommunications unit has a temperature sensor arranged in the close vicinity of the frequency standard device. The microprocessor is configured so that correction magnitudes for slaving the frequency of the frequency standard are stored in a memory element of the microprocessor. An instruction sequence for interrogating the instantaneous resistance value of the temperature sensor, which can be called prior to execution of the unit functions dependent on the frequency standard, is inserted in the program of the microprocessor. A correction voltage for the frequency standard device corresponding to the instantaneous resistance value of the temperature sensor can be determined from the correction magnitude values. In addition, the present invention guarantees an extremely low energy consumption in the additional circuit for compensating for the temperature response of the oscillating crystal.

BRIEF DESCRIPTION OF THE DRAWINGS

The FIGURE show a block diagram of a telecommunications subscriber unit according to the present invention.

DETAILED DESCRIPTION OF THE INVENTION

Operation of the telecommunications subscriber unit is controlled by a microprocessor 1. In telecommunications units, microprocessor 1 is usually restarted at each communication request, and in the interim remains in a "standby" mode so as not to put unnecessary load on the battery capacity.

Inserted into the program of microprocessor 1 is an instruction sequence which is started at each activation of the unit prior to executing of the device functions which depend on the frequency standard. As soon as microprocessor 1 is activated, whether by the push of a button prior to an outgoing call or by an incoming call signal, the instruction sequence evaluates the instantaneous resistance value of an NTC resistor 2 which is arranged in the housing of the subscriber unit in the close vicinity of an oscillator crystal 3.0.1 $\mu F$ capacitor 4 is arranged parallel to NTC resistor 2. The top end of NTC resistor 2 is connected via a 47-kOhm resistor 5 to battery voltage $U_B$, which for has a voltage example 2.5 V. The resistance value of NTC resistor 2 is received up by an internal A/D converter 6. The correction magnitudes needed to control the frequency of oscillator crystal 3 as a function of the temperature measured by NTC resistor 2 are stored in a memory element 7 in microprocessor 1. The correction value determined by computer 8 in microprocessor 1 is converted, in an internal D/A converter 9 in microprocessor 1, into a voltage value which controls a variable-capacitance diode 10 that is connected at the top end of oscillator crystal 3. Oscillator crystal 3 oscillates, for example, at a frequency of 150 MHz. A 560-nH inductance 11 is connected in parallel with oscillator crystal 3. The crystal, now temperature-compensated, can be connected to the oscillator section via a 33-pF coupling capacitor 12. The temperature measurement is repeated by microprocessor 1 at defined time intervals in order to detect any change in temperature.

The limitation according to the invention present of the compensation of the temperature response of an oscillator crystal to the active time of the microprocessor of the telecommunications subscriber unit was not possible until it was recognized that in the standby mode, the frequency accuracy of the oscillator crystal is not of importance for detecting an incoming call.

To determine the correction value, a correction table can be stored in memory element 7 as a correction magnitude. It is also possible, to determine the correction magnitude experimentally as the function describing the temperature response of oscillator crystal 3 which is then stored in memory element 7 and with which computer 8 then determines the respective correction value.

The present invention allows economical crystals with a greater temperature drift can be used for the oscillator crystals, thus resulting in much lower costs.

According to the present invention, because the compensation for the temperature response of oscillator crystal 3 is limited, to the active operating phase of the telecommunications unit, the control circuit provides almost no additional load on the battery of the subscriber unit. The concurrent use of the device's own microprocessor to compensate for the temperature response also offers a savings in terms of components, and is for that reason also economical.

What is claimed is:

1. A telecommunications unit, comprising:
   an oscillator circuit including a frequency standard device for providing a temperature response;
   a programmed microprocessor being actuated by an external start command and including a memory element for storing correction magnitude values; and
   a temperature sensor arranged in a vicinity of the frequency standard device,
   wherein the frequency standard device is controlled as a function of the correction magnitude values,
   wherein the programmed microprocessor controls unit functions of the telecommunications unit using the frequency standard device and includes a program having an instruction sequence, the instruction sequence measuring an instantaneous resistance value of the temperature sensor and being executable prior to an execution of the unit functions, and wherein the frequency standard device receives a correction voltage corresponding to the instantaneous resistance value of the temperature sensor, the correction voltage being determined as a function of the correction magnitude values.

2. The telecommunications unit according to claim 1, wherein the telecommunications unit includes a mobile telephone.

3. The telecommunications unit according to claim 1, wherein the frequency standard device includes a voltage-controlled quartz oscillator.

4. The telecommunications unit according to claim 1, wherein the instruction sequence repeats at predetermined time intervals during the execution of the unit functions.

* * * * *